United States Patent
Kim et al.

(10) Patent No.: US 8,174,189 B2
(45) Date of Patent: May 8, 2012

(54) WHITE LED DEVICE CAPABLE OF ADJUSTING CORRELATED COLOR TEMPERATURE

(75) Inventors: Han Do Kim, Yongin-si (KR); Hyun Min Kim, Yongin-si (KR); Jung Hyun Yoon, Osan-si (KR)

(73) Assignee: Lumimicro Corp., Ltd., Suwon-Si (KR)

( * ) Notice: Subject to any disclaimer, the term of this patent is extended or adjusted under 35 U.S.C. 154(b) by 214 days.

(21) Appl. No.: 12/600,131

(22) PCT Filed: Mar. 5, 2008

(86) PCT No.: PCT/KR2008/001259
§ 371 (c)(1),
(2), (4) Date: Nov. 13, 2009

(87) PCT Pub. No.: WO2008/140181
PCT Pub. Date: Nov. 20, 2008

(65) Prior Publication Data
US 2010/0219770 A1    Sep. 2, 2010

(30) Foreign Application Priority Data
May 14, 2007 (KR) .......... 10-2007-0046446

(51) Int. Cl.
*H01L 29/06* (2006.01)
*H05B 37/02* (2006.01)

(52) U.S. Cl. .................. 313/512; 315/169.1; 315/169.3; 313/498; 257/40; 257/72; 257/759

(58) Field of Classification Search .......... 313/498–500, 313/501–507; 257/40, 72, 98–100, 642–643, 257/759; 315/169.1–169.3
See application file for complete search history.

(56) References Cited

U.S. PATENT DOCUMENTS

| | | | |
|---|---|---|---|
| 2005/0030744 A1* | 2/2005 | Ducharme et al. | 362/231 |
| 2007/0046169 A1* | 3/2007 | Maeda et al. | 313/487 |
| 2007/0223219 A1* | 9/2007 | Medendorp et al. | 362/231 |
| 2007/0257272 A1* | 11/2007 | Hutchins | 257/98 |

FOREIGN PATENT DOCUMENTS

| | | |
|---|---|---|
| EP | 1662583 | 5/2006 |
| JP | 2005-183986 | 7/2005 |
| JP | 2007-080880 | 3/2007 |
| KR | 10-2005-0106945 | 11/2005 |

OTHER PUBLICATIONS

International Search Report dated May 2, 2008, issued in Application PCT/KR2008/001259.

* cited by examiner

Primary Examiner — Tracie Y Green
(74) Attorney, Agent, or Firm — Bryan Cave LLP

(57) ABSTRACT

A white Light Emitting Diode (LED) device that enables the adjustment of a Correlated Color temperature to realize emotional illumination is provided. The white LED device includes a package body for accommodating a plurality of light source units; a first light source unit accommodated in the package body, configured to have one or more first LED chips and a first phosphor, and configured to emit white light having a first Correlated Color Temperature (CCT); a second light source unit accommodated in the package body, configured to have one or more second LED chips and a second phosphor, and configured to emit white light having a second CCT; and a current control unit for varying current, to be supplied to at least one of the first and second LED chips, so as to adjust the first and second CCTs.

8 Claims, 3 Drawing Sheets

WHITE LED DEVICE CAPABLE OF ADJUSTING CORRELATED COLOR TEMPERATURE

CROSS-REFERENCE TO RELATED APPLICATIONS

The present application is a U.S. National Phase patent application under 35 U.S.C. §371 of International Application No. PCT/KR2008/001259, filed Mar. 5, 2008, which claims priority to South Korean Patent Application No. 10-2007-0046446, filed May 14, 2007, both of which are expressly incorporated herein by reference.

TECHNICAL FIELD

The present invention relates, in general, to a white Light Emitting Diode (LED) device that enables the adjustment of a correlated color temperature, and, more particularly, to a white LED device that is provided with white light emission units having different correlated color temperatures, so that it enables the various adjustment of a correlated color temperature according to a user's preference or the state of use, thereby being able to easily implement emotional illumination.

BACKGROUND ART

Recently, Light Emitting Diodes (LEDs) are attracting attention as light sources of backlight units used in notebook computers, monitors, mobile phones, TVs and LCD displays, or as illumination devices. In particular, recently, white light emitting diode devices (hereinafter referred to as 'white LED devices') using LEDs, which are advantageous from the viewpoints of color rendering, the environment, performance improvement and power consumption, have attracted attention. However, when such white LED devices are used as light sources for illumination, no efficient measure for adjusting Correlated Color Temperature (CCT) has been proposed.

For example, in the case in which a white LED device, implemented using blue light and a YAG-based yellow phosphor, is used, high-quality emotional illumination can be realized if the same type of white light is emitted, but white light having a different CCT is emitted according to a human's preference or the state of use. That is, when it is assumed that 4000 K is suitable for the morning, 6000K is suitable for the noon and 3000K is suitable for the evening, it is necessary to automatically or manually adjust the CCT of a white LED device for illumination. If such a function of controlling CCT can be effectively realized, emotional illumination capable of creating a unique atmosphere, as well as providing a basic illumination function of lighting indoor space, can be realized. Furthermore, emotional illumination based on the control of CCT may be applied to psychological treatment, for example, for the stabilization of the psychological state of a human, in combination with the control of luminance.

However, the prior art illumination devices have a problem in that the adjustment of CCT cannot be efficiently realized because they perform only a simple function of controlling illumination based on the intensity of surrounding illumination.

DISCLOSURE

Technical Problem

Accordingly, the present invention has been made keeping in mind the above problems occurring in the prior art, and an object of the present invention is to provide a white LED device that enables the easy and efficient adjustment of a CCT using a relatively simple structure.

Technical Solution

In order to accomplish the above object, the present invention provides a white Light Emitting Diode (LED) device, including a package body for accommodating a plurality of light source units; a first light source unit accommodated in the package body, configured to have one or more first LED chips and a first phosphor, and configured to emit white light having a first Correlated Color Temperature (CCT); a second light source unit accommodated in the package body, configured to have one or more second LED chips and a second phosphor, and configured to emit white light having a second CCT; and a current control unit for varying current, to be supplied to at least one of the first and second LED chips, so as to adjust the first and second CCTs.

According to embodiments of the present invention, the first and the second LED chips may be blue LEDs or Ultra-Violet (UV) LEDs, which are formed of III-group nitride-based semiconductors. Each of the first and second light source units may include a single phosphor, such as a yellow phosphor, or a mixture of two types of phosphor, such as a mixture of green phosphor and orange (or red) phosphor.

According to an embodiment of the present invention, the package body may include first and second reflective cups for respectively accommodating the first and second light source units, and the first LED chips of the first light source unit and the second LED chips of the second light source unit may be mounted in the first and second reflective cups. Furthermore, the first and second phosphor may be respectively dispersed in resin encapsulation parts for encapsulating the first LED chips of the first light source unit and the second LED chips of the second light source unit.

According to an embodiment of the present invention, the difference between the first CCT of the first light source unit and the second CCT of the second light source unit is equal to or greater than 1000 K. For example, the first and second CCTs may have the difference in a range of 1000 K to 20000 K.

According to an embodiment of the present invention, the first light source unit may include two or more first LED chips connected in parallel, and the second light source unit may include two or more second LED chips connected in parallel.

Advantageous Effects

According to the present invention, the CCT of a white LED device can be easily and efficiently adjusted as needed by adjusting the current of at least one of a plurality of light source units having different CCTs, thereby easily realizing high-level LED illumination, such as emotional illumination.

DESCRIPTION OF REFERENCE CHARACTERS OF PRINCIPAL ELEMENTS IN THE DRAWINGS

Figure 1:
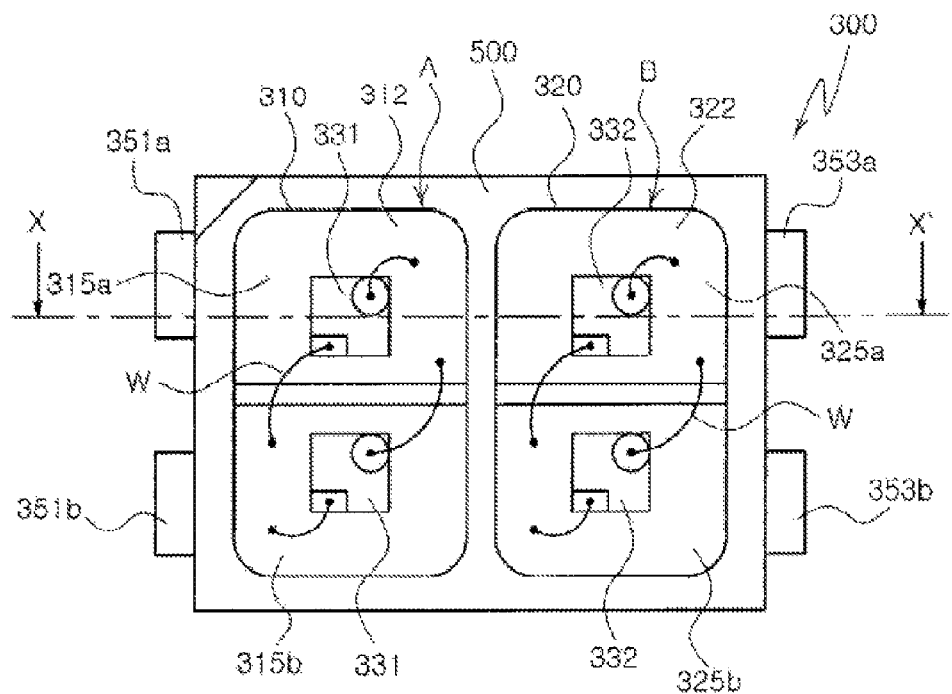
FIG. 1 is plan view showing a white LED device capable of adjusting CCT according to an embodiment of the present invention.

| | |
|---|---|
| 310: | first reflective cup |
| 312, 322: | resin encapsulation part |
| 315a, 315b, 325a, 325b: | electrode pattern |
| 320: | second reflective cup |
| 331, 332: | LED chip, |
| 335, 345: | phosphor |
| 500: | package body |

BEST MODE

Preferred embodiments of the present invention will be described in detail below with reference to the accompanying drawings. However, the embodiments of the present invention may be modified in various forms, and the scope of the present invention is not limited to the following embodiments. The embodiments of the present invention are provided to more completely describe the present invention to those having ordinary knowledge in the related art. Accordingly, the shapes or sizes of elements in the drawings may be exaggerated to provide clearer descriptions, and elements designated by the same reference characters are the same elements.

Figure 2:
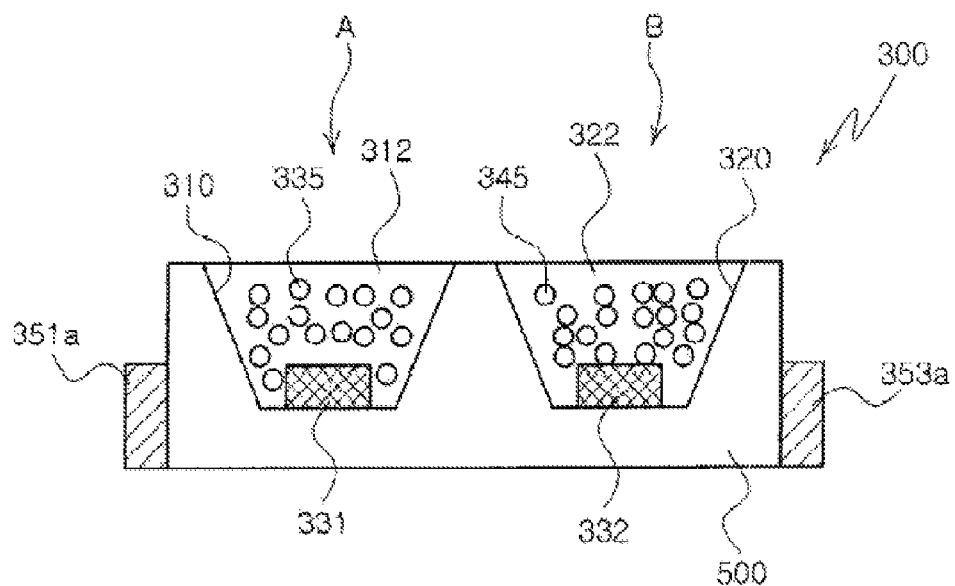
FIG. 2 is a sectional view of the white LED device taken along line XX' in FIG. 1.
Figure 3:
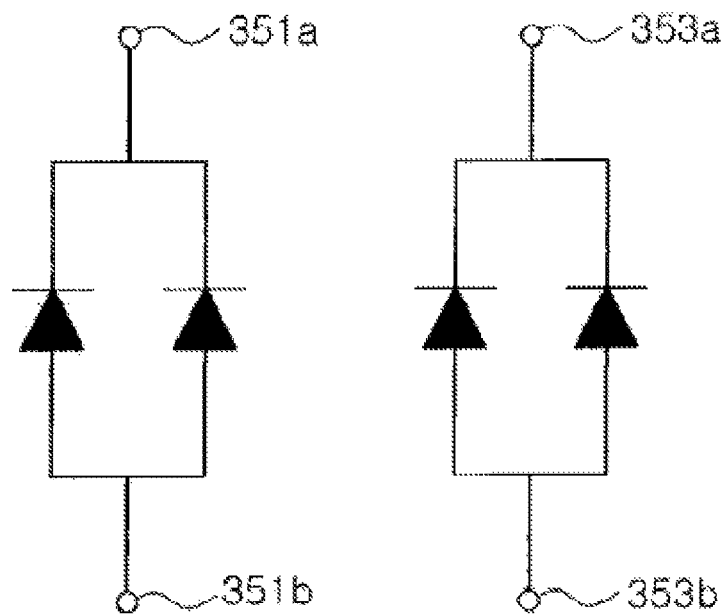
FIG. 3 is a circuit diagram showing the connection of the LED chips of the white LED device in FIG. 1.

FIG. 1 is a plan view showing a CCT-adjustable white LED device according to an embodiment of the present invention. FIG. 2 is a sectional view of the white LED device taken along line XX' in FIG. 1. FIG. 3 is a circuit diagram showing the connection of the LED chips of the white LED device in FIG. 1.

Referring to FIGS. 1 and 2, a white LED device 300 includes a package body 500, and a first light source unit A and a second light source unit B, accommodated in the package body 500 and configured to emit rays of white light having different CCTs. As shown in FIGS. 1 and 2, the package body 500 has a first reflective cup 310 and a second reflective cup 320 for accommodating LEDs, and may function as a heat sink for emitting heat. The first and second reflective cups 310 and 320 are open in the direction of light emission, and are disposed adjacent or close to each other. The two LED chips 331 of the first light source unit A are mounted in the first reflective cup 310, and the two LED chips 332 of the second light source unit B are mounted in the second reflective cup 320.

The LED chips 331 of the first light source unit are connected to electrode patterns 315a and 315b, provided on the bottom of the first reflective cup 310, through appropriate wire bonding W. The two LED chips 331 are connected in parallel through such wire bonding connection (refer to FIG. 3), and the LED chips 331, connected in parallel, are connected to the outside through two lead terminals 351a and 351b.

Furthermore, the LED chips 332 of the second light source unit B are connected to electrode patterns 325a and 325b, provided on the bottom of the second reflective cup 320, through appropriate wire bonding W. The two LED chips 332 are connected in parallel through such wire bonding connection (refer to FIG. 3), and the LED chips 331, connected in parallel, are connected to the outside through two other lead terminals 353a and 353b.

A resin encapsulation part 312 (for example, epoxy or silicon resin) for encapsulating each of the LED chips 331 is formed over the LED chip 331 of the first light source unit A, and a first phosphor 335 (for example, a silicate-based yellow phosphor) is dispersed in the resin encapsulation part 312. Based on the construction of the first light source unit A, having a combination of the LED chips 331 and the first phosphor 335, when forward operating voltage is applied to the LED chips 331, the first light source unit A emits white light having a first CCT.

For example, III-group nitride-based blue LED chips, such as GaN-based blue LED chips, may be used as the LED chips 331, and a silicate-based, YAG-based or TAG-based yellow phosphor may be used as the first phosphor 335. In this case, the first phosphor 335 is excited by blue light emitted from the LED chips 331 and then emits yellow light, in which case the blue light and the yellow light are mixed together, with the result that white light having a first CCT may be emitted. The CCT of the first light source unit may vary with the material of the phosphor, or the amount of phosphor dispersed in the resin encapsulation part.

As another example, the first light source unit A may emit white light using III-group nitride-based blue LED chips as the LED chips 331 and a combination or mixture of green and orange phosphor as the first phosphor. As a further example, the first light source unit A may emit white light using III-group nitride-based ultraviolet LED chips as the LED chips 331 and a mixture of blue, green and red phosphor as the first phosphor. Additionally, appropriate LEDs and a mixture of two or more types of phosphor may be used.

Furthermore, a resin encapsulation part 322 for encapsulating each of the LED chips 332 is formed over the LED chip of the second light source unit B, and a second phosphor 345 (for example, yellow phosphor or a mixture of green and orange phosphor) is dispersed in the resin encapsulation part 322. When forward operating voltage is applied to the LED chips 332 of the second light source unit B, the second light source unit B emits white light having a second CCT different from the first CCT. For example, the second CCT may be lower than the first CCT (or conversely, the second CCT may be higher than the first CCT).

For example, the second light source unit B may emit white light using III-group nitride-based blue LED chips, such as GaN-based blue LED chips, as the LED chips 332 and yellow phosphor as the second phosphor. In this case, the CCT (second CCT) of the white light of the second light source unit B is set to a value different from that of the CCT (first CCT) of the first light source unit A. For example, the CCTs of the white light of the light source units A and B may be set to different values by setting the relative light intensity in the blue region and the relative light intensity in the green and red regions (or the yellow region) to different values in the light emission spectra of respective light source units. The relative difference between the light intensity in the long wavelength region and the light intensity in the short wavelength region can be adjusted using the type of phosphor or the added amount thereof. For example, the CCT of white light decreases in proportion to an increase in the amount of yellow phosphor that is dispersed in the blue LED chip. Here, white having a relatively low CCT corresponds to relatively warm white, whereas white having a relatively high CCT corresponds to relatively cool white.

The white light of the first light source unit A and the white light of the second light source unit B having different CCTs, as described above, are mixed together, so that resulting white light is emitted to the outside. In this case, as illustrated in FIGS. 1 and 2, since the first light source unit A and the second light source unit B are disposed close to each other, the section in which the white light of the first light source unit A and the white light of the second light source unit B are mixed together is short, and thus finally emitted white light is relatively desirable.

It is desirable that the difference between the first CCT and the second CCT be equal to or greater than 1000 K, preferably, in a range of 1000 K to 20000 K, in order to efficiently adjust the CCT of finally emitted white light. A third CCT can be realized by mixing rays of white light having different CCTs together, and the finally emitted third CCT may be adjusted by controlling the amounts of light or the current of the first light source unit A and the second light source unit B.

For example, fixed current may be applied to the first light source unit A through the two lead terminals 351a and 351b, and variable controlled current may be applied to the second light source unit B through the two lead terminals 353a and 353b. For this purpose, the lead terminals 351a and 351b of the first light source unit A and the lead terminals 353a and 353b of the second light source unit B are supplied with external power to enable them to operate independently of each other. In particular, the lead terminals 353a and 353b of the second light source unit B are supplied with voltage independently of the first light source unit A, so that the lead terminals 353a and 353b can be supplied with variable current.

Figure 4:
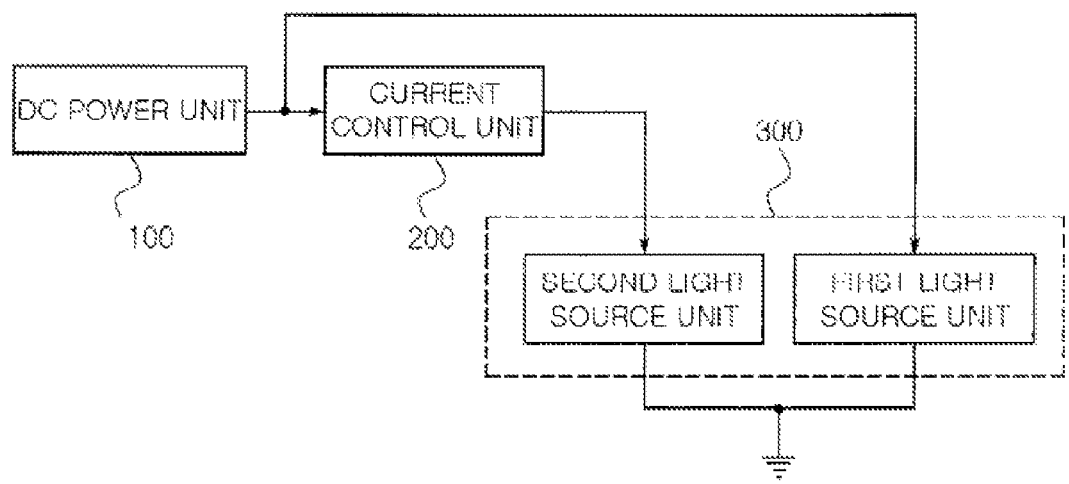
FIG. 4 is a block diagram illustrating current control used in the embodiment of the present invention.

A current control device for adjusting current and then driving respective light source units independently is shown in FIG. 4. As shown in FIG. 4, DC voltage, input from a DC power unit 100, may be variably adjusted using a current control unit 220, and may then be applied to the second light source unit B of the white LED device 100. Alternatively, fixed DC voltage may be applied to the first light source unit A without passing through the current control unit 220. If the second light source unit B emits warmer white light than the first light source unit A emits (that is, if the CCT of the second light source unit B is lower than the CCT of the first light source unit A), the white LED device can reduce the CCT of finally emitted white light (the finally emitted white light becomes warm white) by increasing the current of the second light source unit B. In contrast, the white LED device 100 can increase the CCT of the final white light (the finally emitted white light becomes cool white) by decreasing the current flowing through the second light source unit B.

parallel or series to one another, or a single LED chip. Meanwhile, an appropriate one selected from the group consisting of a yttrium-based phosphor, an aluminum-based phosphor, a garnet-based phosphor, a nitride-based phosphor, a beryllium-based derivative, a zinc selenide-based phosphor and a silicate-based phosphor may be used as the phosphor.

Furthermore, additionally, in order to adjust the color sensation or color rendering index of the finally emitted light of the white LED device, the composition, ratio or density of phosphor used may be variously selected and used.

EMBODIMENT

The fact that the CCT of emitted white light could be efficiently adjusted was ascertained by fabricating a sample, such as the white LED device of FIGS. 1 and 2, according to the present invention and varying the current applied to the second light source unit B.

With regard to the sample of the embodiment, GaN-based blue LEDs were used as the LED chips of the first and second light source units A and B, and a silicate-based yellow phosphor was used as the phosphor of the light source units A and B. The CCT (second CCT) of the second light source unit B was made lower than the CCT (first CCT) of the first light source unit A by making the light intensity in the short wavelength region and the light intensity in the long wavelength region different from each other with respect to the two light source units A and B (the relative intensities could be made different by making the amounts of phosphor different from each other), as follows:

(1) First Light Source Unit (A):
CIE color coordinates: x=0.264, y=0.253
CCT=18,944 K
(2) Second Light Source Unit (B):
CIE color coordinates: x=0.439, y=0.438
CCT=3,000 K For the white LED device provided with two light source units having different CCTs as described above, a fixed current of 30 mA was applied to the first light source unit A, while currents of 0 mA, 15 mA, 30 mA, 45 mA, 60 mA, 75 mA and 90 mA were applied to the second light source unit B. While current applied to the second light source unit B for emitting warm white light was varied, the color coordinates, CCTs and light intensity of the emitted white light of the sample were measured at respective currents. The results of the measurement are listed in the following Table 1:

TABLE 1

| Current of second light source unit | X coordinate (color coordinate) | Y coordinate (color coordinate) | I peak (nm) | Light intensity (cd) | Radiation intensity (mW/sr) | CCT |
| --- | --- | --- | --- | --- | --- | --- |
| 0 mA | 0.264 | 0.253 | 455 | 2.87 | 10.9 | 18944 |
| 15 mA | 0.301 | 0.291 | 457 | 4.21 | 14. | 7860 |
| 30 mA | 0.330 | 0.321 | 458 | 5.84 | 18.9 | 5629 |
| 45 mA | 0.346 | 0.339 | 460 | 7.23 | 22.5 | 4924 |
| 60 mA | 0.356 | 0.350 | 459 | 8.46 | 26.0 | 4584 |
| 75 mA | 0.362 | 0.358 | 459 | 9.52 | 28.7 | 4412 |
| 90 mA | 0.367 | 0.365 | 460 | 10.45 | 31.2 | 4306 |

*Current of first light source unit = 30 mA (fixed)

Figure 5:
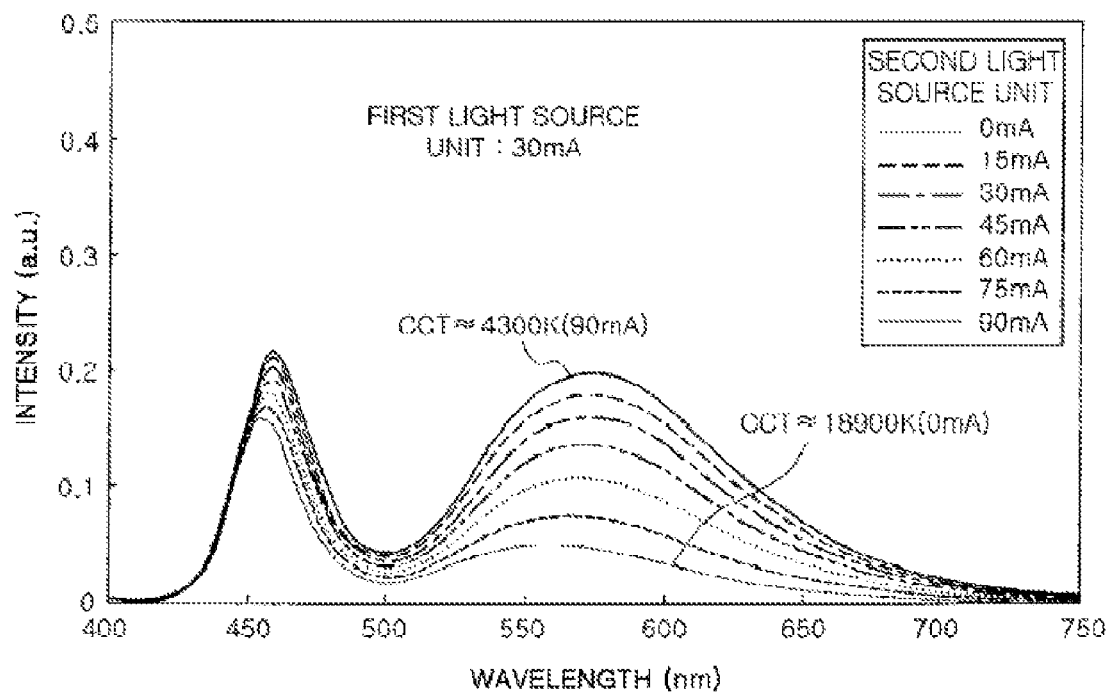
FIG. 5 is a graph showing the variable light emission spectra of the white LED device according to the embodiment of the present invention.

Although, in the above-described embodiment, each of the light source units uses two LED chips connected in parallel to each other, the present invention is not limited thereto. For example, each light source unit may use LED chips connected in series to each other, three or more LED chips connected in The light emission spectra of the sample of the 5 embodiment of emitted white light at respective currents are shown in FIG. 5. From the above Table 1 and FIG. 5, it can be seen that the CCT of emitted white light can be considerably efficiently adjusted over a range of about 4300 K to about 18900 K by varying the current applied to 10 the second light source unit B, which emits relatively warm white light (white light having a relatively low CCT) compared to the first light source unit A, from 0 mA to 90 mA.

Furthermore, since, in the embodiment, the cold white light source unit (first light source unit) and the warm white light source unit (second light source unit) are separated from each other by the reflective cups, there is no optical loss or reduction in efficiency attributable to the phosphor particles of the other light source unit. Furthermore, since the two light source units having different CCTs are disposed adjacent or close to each other, the section in which rays of white light emitted from the two light source unit are mixed together is very short. Therefore, finally emitted white light resulting from the mixture of the rays of white light emitted from the two light source units can be considered to be relatively uniform.

The present invention is not limited to the above described embodiments and the accompanying drawings, but is intended to be defined by the attached claims. It will be apparent to those skilled in the art that various replacements, variations and modifications are possible within a range that does not depart from the technical spirit of the present invention.

The invention claimed is:

1. A white Light Emitting Diode (LED) device, comprising:
   a package body for accommodating a plurality of light source units;
   a first light source unit accommodated in the package body, configured to have one or more first LED chips and a first phosphor, and configured to emit white light having a first Correlated Color Temperature (CCT);
   a second light source unit accommodated in the package body, configured to have one or more second LED chips and a second phosphor, and configured to emit white light having a second CCT;
   a current control unit for varying current, to be supplied to at least one of the one or more first and second LED chips, so as to adjust the CCT of the final emitted white light,
   wherein the first and the second LED chips are the same, the first and the second phosphors are the same, and wherein an amount of the first and the second phosphors dispersed in the first and the second LED chips is different from each other so as to adjust the first and second CCTs.

2. The white LED device as set forth in claim 1, wherein the first and second LED chips are blue LEDs, and the first and second phosphor is yellow phosphor.

3. The white LED device as set forth in claim 1, wherein the first and second LED chips are blue LEDs or ultraviolet LEDs, and the first and second phosphor is a combination of two or more types of phosphor.

4. The white LED device as set forth in claim 1, wherein the package body comprises first and second reflective cups for respectively accommodating the first and second light source units;
   wherein the first LED chips of the first light source unit and the second LED chips of the second light source unit are mounted in the first and second reflective cups, and the first and second phosphor are respectively dispersed in resin encapsulation parts for encapsulating the first LED chips and the second LED chips.

5. The white LED device as set forth in claim 1, wherein a difference between the first CCT of the first light source unit and the second CCT of the second light source unit is equal to or greater than 1000 K.

6. The white LED device as set forth in claim 5, wherein the difference falls within a range of 1000 K to 20000 K.

7. The white LED device as set forth in claim 1, wherein the first light source unit comprises two or more first LED chips connected in parallel, and the second light source unit comprises two or more second LED chips connected in parallel.

8. The white LED device as set forth in claim 1, wherein the phosphor is one or a combination of two selected from the group consisting of a yttrium-based phosphor, an aluminum-based phosphor, a garnet-based phosphor, a nitride-based phosphor, a beryllium-based derivative, a zinc selenide-based phosphor, and a silicate-based phosphor.

* * * * *